United States Patent [19]

Staiger

[11] 4,203,543
[45] May 20, 1980

[54] PATTERN GENERATION SYSTEM

[75] Inventor: Dieter Staiger, Weil im Schonbuch, Fed. Rep. of Germany

[73] Assignee: International Business Machines Corporation, Armonk, N.Y.

[21] Appl. No.: 930,947

[22] Filed: Aug. 4, 1978

[30] Foreign Application Priority Data

Oct. 18, 1977 [DE] Fed. Rep. of Germany ....... 2746743

[51] Int. Cl.$^2$ .......................... G06F 1/04; G06F 11/00
[52] U.S. Cl. ........................................ 371/24; 364/200
[58] Field of Search ................ 235/302; 364/200, 900; 307/106; 328/58

[56] References Cited

U.S. PATENT DOCUMENTS

| | | | |
|---|---|---|---|
| 3,659,087 | 4/1972 | Green et al. .......................... 364/486 |
| 3,713,097 | 1/1973 | Linnerooth et al. ....... 340/146.3 ED |
| 3,719,885 | 3/1973 | Carpenter et al. .................. 324/73 R |
| 3,737,637 | 6/1973 | Frankeny et al. .................. 235/302.2 |
| 3,764,992 | 10/1973 | Milne ................................ 364/200 |
| 3,789,195 | 1/1974 | Meier et al. .......................... 235/92 T |
| 3,805,152 | 4/1974 | Ebersman et al. ................ 324/73 R |
| 3,824,378 | 7/1974 | Johnson et al. .................. 235/92 PE |
| 3,930,144 | 12/1975 | Tanaka ................................ 364/718 |
| 3,956,616 | 5/1976 | Knollenberg .................... 235/92 CC |
| 4,041,387 | 8/1977 | Dalichow et al. ................. 324/78 R |

FOREIGN PATENT DOCUMENTS 1187505 4/1970 United Kingdom ..................... 364/701

OTHER PUBLICATIONS

E. Legnard et al., "Pattern Generating System", *IBM Technical Disclosure Bulletin*, vol. 14, No. 2, Jul. 1971, pp. 482-484.

*Primary Examiner*—Jerry Smith
*Attorney, Agent, or Firm*—Francis J. Thornton

[57] ABSTRACT

This discloses a pattern generator having a programmable product cycle timer in which a pulse train, i.e., the pattern generated can be repeated or switched from a first pulse frequency to a second pulse frequency without the usual transient switching periods between pulses. The invention accomplishes this by providing the generator with a cycle timer using a clock operating in conjunction with a down counter so that at a preselected time interval, before the end of the pulse is achieved, a test is made to determine if a required condition needing a different pulse frequency exists. If such a condition does not exist the present pulse frequency is reinitiated so that at count 0 it is repeated without delay. If the required condition does exist loading of the needed pulse frequency is initiated so that upon termination of the presently existing pulse at count 0, the newly selected pulse will be introduced into the product being tested without delay.

9 Claims, 3 Drawing Figures

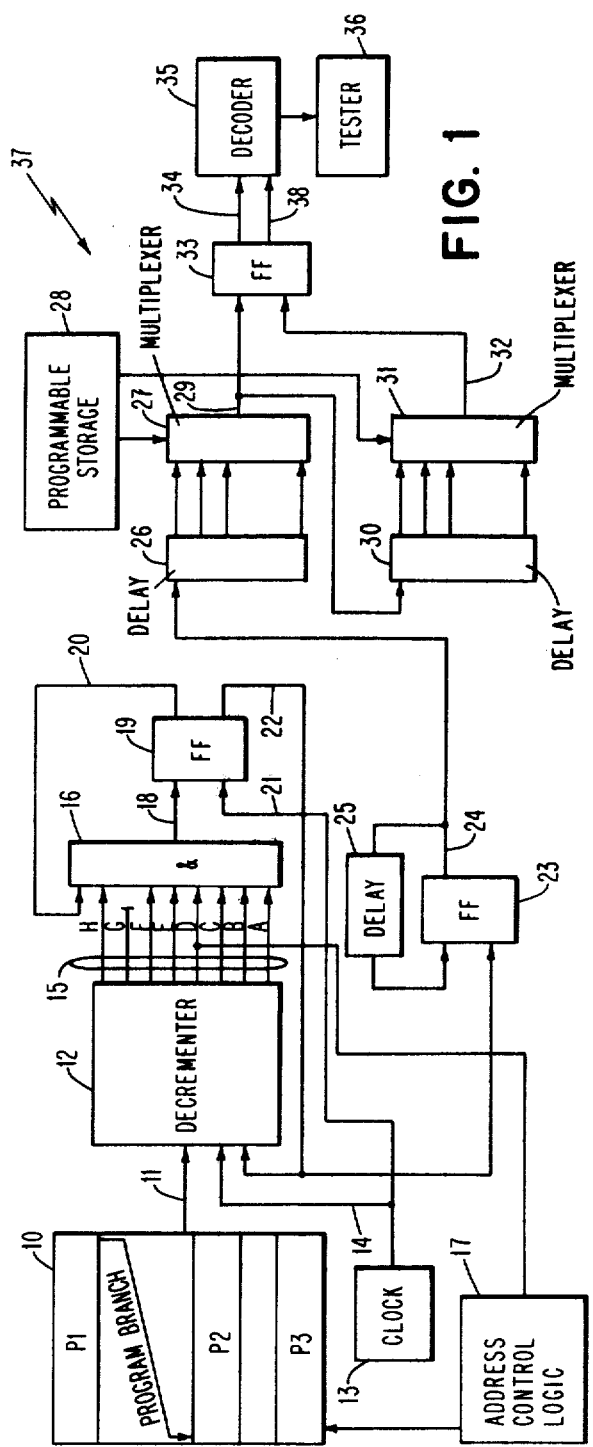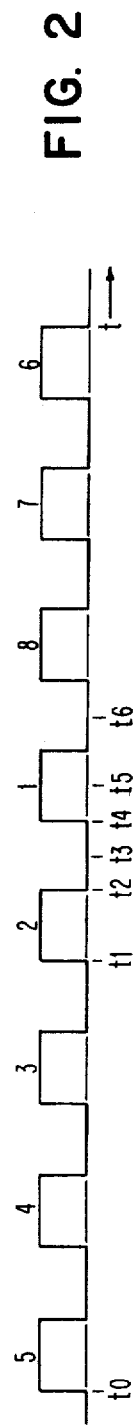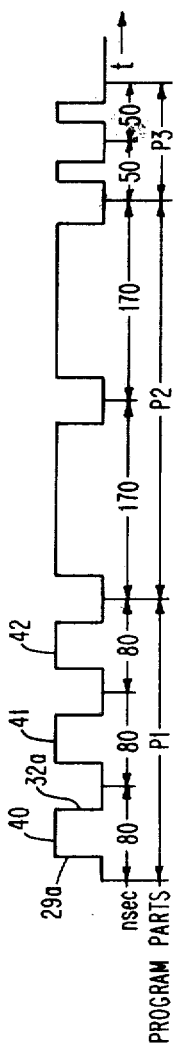

PATTERN GENERATION SYSTEM

DESCRIPTION

Technical Field

This invention relates to digital test equipment, particularly to test equipment needed for large scale integrated circuit device testing, and more particularly, to the pattern generator for applying pulse patterns to the product being tested.

Background Art

Test pattern generators are well known to the prior art. In the past such generators were specifically designed to produce a series of particular unvarying pulse sequences designed for the particular product being tested. Generally, selected pulse patterns are stored in a memory whose output is fed into a buffer register on demand. From this buffer register the pattern is decoded and introduced into a test system. In such prior art generators new information was not supplied to the buffer register until the old information was exhausted and an end of pattern signal was received by the memory. Thus, whenever it was necessary to switch from one pulse pattern to another a waiting time was necessary before the second pulse pattern could be applied to the product. During these waiting times the product being tested could undergo certain changes such as a discharge of capacitance which could seriously affect the test results being obtained.

BRIEF SUMMARY OF THE INVENTION

It is an object of this invention to provide a pulse pattern generator that can provide to a memory product being tested a series of patterns without time delay between the end of one pattern and the beginning of the following pattern.

This invention is directed to a pulse pattern generator that can provide to a memory product being tested a series of pulses with different frequencies without time delay between the end of one pulse and the beginning of the following pulse.

It is another object of the invention to provide a pattern generator with a means that permits, before the end of each pulse, determining if the present pulse is to be repeated or replaced with a new pulse having a different frequency.

BRIEF DESCRIPTION OF THE DRAWING

These and other features of the present invention will be more fully appreciated and understood by considering the following description taken in conjunction with the accompanying drawing in which:

FIG. 1 depicts a schematic circuit for a pulse generator provided with means for generating a series of pulses without a time delay between each pulse.

FIG. 2 illustrates a number of count pulses from the down counter with specific times set out that are related to the operation of the circuit in FIG. 1.

FIG. 3 is a representation of successive pulse patterns with different frequences used in the circuit of FIG. 1.

DETAILED DESCRIPTION

Referring now to the drawing, there is shown in FIG. 1 a pattern generator comprising two memories 10 and 28, a clock 13, an address control logic circuit 17, a programmable cycle timer 37 and a decoder 35. This generator is coupled to a product tester 36 containing a unit to be tested. The generator is provided with the cycle timer 37 so that the pulses comprising the patterns generated by the generator can be supplied to the tester without a transient switching period between them. The memory 10 stores therein a plurality of pulse cycle time sequences P1, P2 and P3 more clearly illustrated in FIG. 3. This memory, or storage 10, has an output 11 which is fed into a down counter or decrementer 12 contained in the cycle timer 37. The clock 13 also feeds a clocking signal into the down counter 12 via line 14. The down counter 12 becomes set when a programmed pulse cycle time sequence including a start count signal is received from the storage 10. This programmed sequence sets the value of the cycle time in counter 12, that is, the length of the period in which the pulse is to appear is programmed. Thus, for example, the initial program P1 calls for three eighty nanosecond periods in which pulses 40, 41 and 42, shown in FIG. 3, appear. Thus, the program P1 contains a code that will set the down counter 12 to count an eighty nanosecond period by counting eight ten nanosecond clock cycles.

The down counter 12 is provided with a plurality of output lines 15A through 15H. An output signal on line 15A represents count 8; on line 15B, count 7; on line 15C, count 6; on line 15D, count 5; on line 15E, count 4; on line 15F, count 3; on line 15G, count 2; and on line 15H, count 1. These lines, 15A, 15B, 15C, 15D, 15E, 15F, and 15H are connected to an AND gate circuit 16. Line 15G, representing count 2, is unconnected. Line 15D, representing count 5, is also connected to an address control logic circuit 17 which in turn is coupled back into the storage 10.

For purposes of illustration only, it will be assumed that the AND circuit 16 is on when there is no signal on any of the input lines 15A, 15B, 15C, 15D, 15E, 15F, 15H and 20. It is also assumed that the address control circuit 17 is responsive to a signal on line 15D. When the counter 12 reaches count 5, that is, fifty nanoseconds before the end of each programmed period, line 15D has an output signal thereon and sends a signal to the output control logic circuit 17. This address control logic circuit 17 checks the storage 10 to determine as to what the next period is to be. In the present example, at fifty nanoseconds before the end of the period including pulse 40, logic circuit 17 would determine that the program P1 calling for another eighty nanosecond period is to continue. In this instance nothing further occurs with this signal. Later at time T1, FIG. 2, when count 2 is reached because line 15G is not connected to the AND gate 16 all inputs to the AND gate are negative and the AND gate 16 is activated. When the AND gate 16 is activated, an output trigger signal appears on line 18. However, because of inherent time delays no output appears on line 18 until time t3. This output signal is fed via line 18 to a flip-flop circuit 19. At time t4 the next clock cycle (count 1) is received by flip-flop 19 without delay via line 21 directly from clock 13. The application of these coincidental signals, the clock signal and the AND gate signal, to the flip-flop 19, causes flip-flop 19 to switch its output to line 20 which feeds back into the AND gate 16 causing the AND gate 16 to shut off. When the AND gate 16 shuts off flip-flop 19 switches back to its initial state creating an output signal on line 22. This output signal on line 22 is fed back to the down counter 12 to prepare the counter for the next reloading of the second eighty nanosecond period from the storage 10 so that at time t6 the next period in program P1, i.e., the period containing pulse 41 will be initiated from the storage 10 without delay. When this second period is introduced into down counter 12 the down counting process begins anew.

The output signal from the flip-flop 19 on line 22 is also fed into an additional flip-flop circuit 23. With the appearance of the output signal on line 22, the flip-flop 23 is activated supplying a cycle start signal on line 24 leading to delay unit 25 and a pulse selection circuit. The cycle start signal to delay 25 is fed back to an input of the flip-flop 23 to switch the flip-flop back to its initial state and to shut off the signal on line 24.

The pulse selection circuit comprises delays 26 and 30, multiplexes 27 and 31, storage 28 and flip-flop 33. The delay unit 26 has a plurality of output lines, each of which is associated to specific delay time, leading to a multiplex circuit 27 which receives via a separate line an instruction from a programmable storage 28 as to which output line of the delay unit 26 is to be selected. Thus the cycle start signal fed to delay 26 is delayed in delay 26 for a specific time after which it is permitted to pass through the multiplex circuit 27 to output line 29 where it is applied to a flip-flop circuit 33 and to a second delay circuit 30. This signal causes flip-flop 33 to become set so that an output signal appears on line 34 leading to the pattern generator 35. This output signal on line 34 determines the start, i.e., the position of the leading edge 29a of pulse 40 within the first eighty nanosecond period of program P1. Delay circuit 30 also has a multiplicity of output circuits feeding a second multiplex circuit 31. This multiplex circuit also receives an input from the programmable storage 28 so that it also selects a specific output line of the delay unit 30 for a specific delay time. When the second multiplex circuit 31 is activated, an output signal from it appears on line 32 which is also fed into the flip-flop circuit 33 to return the flip-flop 33 to its initial state and terminate the pulse 40. Thus, this second delay-multiplex circuit arrangement determines when pulse 40 terminates during this eighty nanosecond time period. That is, this second arrangement determines when the trailing edge 32a of pulse 40 occurs. Thus, the input circuit from the first multiplex circuit 27 fed into flip-flop 33 causes the flip-flop 33 to be activated to control the leading edge 29a of the pulse 40. The subsequent activation of the delay circuit 30 and the multiplex circuit 31 and the appearance of the pulse on line 32 causes the flip-flop 33 to be switched back to its other state to terminate pulse 40 and this controls the time of the trailing edge 32a of the pulse 40. In this way, be selectively programming the multiplex circuits 27 and 31 and by selection of the delay times of delays 26 and 30, pulses are generated on lines 34 and 38 to provide a pulse 40 of predetermined width within the programmed eighty nanosecond time period.

This storage 28 is synchronized with the storage 10. One way of achieving this is by providing a suitable signal from the storage 10 to the storage 28. Alternately, the storage 28 need not be a separate unit but could be a portion of storage 10.

As noted above, it was indicated that when a line 15D was active the address control logic 17 determined that during the first eighty nanosecond period (pulse 40) that no program branching would occur and that a second eighty nanosecond period (pulse 41) was to follow. Thus, immediately upon the termination of the first eighty second nanosecond period (pulse 40), a second eighty nanosecond period (pulse 41) would immediately begin without any delay and the same sequence of events described above again occurs during this second eighty nanosecond period.

Fifty nanoseconds before the end of the third eighty nanosecond period (pulse 42), a program branching to program P2 calling for 170 nanosecond periods would be indicated. At that time, the program P2 would become loaded into the system so that immediately upon termination of this third eighty nanosecond period (pulse 42) the 170 nanosecond period called for by program P2 would become introduced and the clock cycle and count cycle reset to this new lengthened period. Thus, as shown in FIG. 3, the width of the cycle time set out in program P2 is 170 nanoseconds, requiring a new count of 17 to be introduced into the down counter. Although the count is extended from eight to seventeen, no change is required in the described invention for again at count 5, i.e., 50 nanoseconds before the end of the period, a check is made to determine the length of the next period required and at count 2, twenty nanoseconds before the end of the period the next period is set into the system as described above. Thus, there has been described a system whereby the generation of each pulse follows without delay the expiration of the previous pulse. This circuit thus assures that any branch operation can be executed and any new pulse is loaded into the system at a time when the old contents would have been counted down to the zero value.

For generating the periodic sequence of different successive pulse sequences, a program is used. The program language to be used comprises different statements. Such program statement has the following schematic structure:

| | |
|---|---|
| I | Address |
| II | OP Code |
| III | Condition |
| IV | Cycle Time |
| V | Address Modification |
| VI | Control Bits |
| VII | Data |
| VIII | Timing |

I. This address indicates the branching of the program and under this address a program part for generating a specific pulse sequence is stored.

II. The operation code indicates among other items whether or not the program is to be executed with the address following directly in the storage or whether a branch program is to be made.

III. This condition indicates when the operation code is to be executed, that is, when a specific storage address is reached or when a specific error appears in the storage being tested.

IV. The cycle time indicates the duration of the pulse cycle. This data is given with regard to a specific product.

V. The address modification refers to data for increasing the storage address per cycle.

VI. The control bit controls the writing into the buffer or into the storage system or the reading out of the storage system.

VII. This data represents the information on the data pattern for the writing in during the cycles, and VIII. The timing refers to data on the pulse length and spacing as required by the product.

Thus, the invention provides a circuit for generating pulse patterns which can be used to test memory products and in which the different pulse patterns follow one and other without delay. In summary, the pulse patterns are generated by a program located in the storage in accordance with the product for which they are to be used. The language employed for this purpose provides for each instruction to include time data indicative of the total time required by product cycle including branching operations, if any. In other words, these time data indicate when the next instruction starts so that it is possible to switch from one pulse sequence to another without delay whenever a particular condition is encountered.

While the invention has been particularly shown and described with reference to preferred embodiments thereof, it will be understood by those skilled in the art that various changes in form and details may be made therein without departing from the spirit and scope of the invention.

What is claimed is:

1. A pattern generator for supplying a series of pulses of varying time periods without transient switching times between the pulses comprising:

a memory, said memory storing programmed sequences of pulse cycle times, each of said sequences having a respective cycle time, a clock, an address control logic circuit, a decoder, a tester coupled to said decoder, and programmable cycle timer means having inputs coupled to said clock and said memory and outputs coupled to said address control logic circuit and said decoder for determining prior to the end of each pulse cycle time in a sequence if a different pulse cycle time is required, and for loading the next programmed pulse cycle time prior to the end of the present cycle time so that upon termination of the present cycle time the next pulse cycle time will be introduced into the tester without any transient switching period between said cycle times.

2. The pattern generator of claim 1 wherein said programmable cycle timer comprises a clock driven down counter, output selection means coupled to the counter and responsive to a selected output of said counter for providing an output trigger signal, feedback means for returning said trigger signal to said selection means for terminating said trigger signal, means for feeding said trigger signal to said counter for setting said counter to load said next cycle time from said memory, and means for selecting the pulse position within said cycle time.

3. The pattern generator of claim 2 wherein said output selection means comprises an AND gate coupled to a flip-flop circuit, said flip-flop circuit having first and second inputs and first and second outputs, said first input being coupled to said AND circuit, said second input being coupled to said clock, said first output being coupled to said feedback means, and said second output being coupled to said counter and to a first input of a double input-single output flip-flop.

4. The pattern generator of claim 3 wherein said output of said double input-single output flip-flop is fed through a delayed feedback loop to the second input of said double input flip-flop and to a pulse selection circuit.

5. The pattern generator of claim 4 wherein said pulse selection circuit has a pair of outputs coupled to a decoder for determining the position and width of the pulse within a respective cycle time.

6. The pattern generator of claim 5 wherein said pulse selection circuit comprises first and second delay circuits, first and second programmed multiplex circuits coupled to said first and second delay circuits, respectively, and a third flip-flop coupled to said multiplex circuits, said first delay circuit having a multiplicity of selectable outputs coupled to said first programmed multiplex circuit for selecting one of said outputs and feeding said output to said third flip-flop to determine the leading edge of said pulse and to said second delay circuit having a multiplicity of selectable outputs coupled to said second programmed multiplexer for selecting one of said outputs and feeding said selected output to said third flip-flop to terminate said pulse.

7. The pattern generator of claim 6 wherein said third flip-flop has its output coupled to said decoder.

8. The pattern generator of claim 7 wherein said first and second multiplexers are controlled by a memory to provide single selected output signals.

9. The pattern generator of claim 2 wherein said down counter has an output coupled to said address logic control circuit.

* * * * *